United States Patent [19]

Zaleckas

[11] 4,034,149
[45] July 5, 1977

[54] SUBSTRATE TERMINAL AREAS FOR BONDED LEADS

[75] Inventor: Vincent Joseph Zaleckas, Union, N.J.

[73] Assignee: Western Electric Company, Inc., New York, N.Y.

[22] Filed: Oct. 20, 1975

[21] Appl. No.: 624,136

[52] U.S. Cl. .................................. 174/68.5; 29/628
[51] Int. Cl.² ............................................ H05K 1/10
[58] Field of Search ............. 174/94 R, 68.5, 52 R, 174/52 FP; 228/4.1, 5.1, 6, 6.1; 29/581, 582, 583, 625, 628

[56] References Cited

UNITED STATES PATENTS

| | | | |
|---|---|---|---|
| 3,256,465 | 6/1966 | Weissenstern et al. | 174/68.5 UX |
| 3,418,444 | 12/1968 | Ruehlemann | 174/94 R |
| 3,528,174 | 9/1970 | Harrison | 174/68.5 X |
| 3,567,844 | 3/1971 | Kecmar | 174/68.5 |
| 3,698,073 | 10/1972 | Helda | 174/52 FP |
| 3,705,047 | 12/1972 | Marriott | 174/68.5 X |
| 3,834,604 | 9/1974 | Fendley et al. | 228/5.1 |
| 3,841,905 | 10/1974 | Dixon | 174/68.5 X |

*Primary Examiner*—Arthur T. Grimley
*Attorney, Agent, or Firm*—W. O. Schellin

[57] ABSTRACT

A plurality of separate metallized regions on a substrate form a bondsite for a single lead to be bonded to the substrate. The metallized regions are electrically interconnected at a point removed from the bondsite. Such multiple metallized regions offer redundant bonds for each such lead to improve the mechanical strength and to improve the reliability of the bond between the lead and the substrate.

4 Claims, 6 Drawing Figures

SUBSTRATE TERMINAL AREAS FOR BONDED LEADS

BACKGROUND OF THE INVENTION

1. Field of the Invention

The present invention relates broadly to bonding one article to another. More particularly, the invention relates to bonding electrical leads to substrates. For example, an integrated circuit package usually has leads which extend from such package to permit it to be assembled into a larger circuit system. Inside the package, however, the leads are bonded to a microcircuit. A known package structure uses a small ceramic or glass substrate as a base element to which the leads and one or more semiconductor chips are bonded. A metal pattern on the substrate is coupled to contacts on the chips and also provides bond sites for the inner ends of the leads. While the present invention ideally applies to the described circuit package, it is not limited to such an area of technology.

2. Description of the Prior Art

A common bonding technique for attaching leads to a substrate is "thermocompression bonding." According to this technique a metal-to-metal bond is established between a metallized bond site on the substrate and a lead through the combination of thermal and compressive energy. The energy is applied to the lead through a thermode and is directed toward the corresponding bond site of the substrate to join the metal at the interface between the lead and the substrate at temperatures below the melting point of the interface metal. Typical structures for such substrate-lead bonds involve glass or ceramic substrates having thin film metal patterns which are in the order of 20,000 angstroms thick. These metal patterns form the bond sites and the interconnecting conductors to circuit chips mounted to the substrate. The leads to be bonded are typically 0.020 by 0.010 inch in cross section. As a bonding force is applied to the leads by the thermode, the lead material deforms and flattens, and the bond between the leads and the corresponding bond sites is formed.

In bonds which have been formed in accordance with the outlined technique, bond failures tend to occur which are characterized by the separation of bonded leads from their bond sites and by the occurrence of a break in the substrate material itself rather than at the interface between the lead and the bond. The failure mechanism is consequently commonly referred to as substrate pullout or substrate cavitation.

Various studies have been undertaken to overcome the problem of substrate cavitation. One of these studies resulted in the invention disclosed in U.S. Pat. No. 3,834,604 to Fendley et. al. which is assigned to the assignee of the present invention. According to the Fendley et al. disclosure, blanked-out leads which typically have been employed by the industry are modified to the extent that preferably two or more interposed and specially contoured complaint contacts are formed on each of the leads to be bonded to the substrate. The preshaping of the contacts into pyramidal shapes of essentially triangular cross-section provides compliancy and further produces redundant bonds to insure against total bond failures.

While the Fendley et al. procedure tends to minimize or to overcome the problem of failures by cavitation between leads and ceramic or glass substrates, special equipment for preshaping the compliant bond pads onto the ends of the leads is required. The additional equipment expense adds to the manufacturing cost of circuit packages, tending to offset gains from increases in yields because of decreased bond failures.

It is, therefore, desirable to minimize bond failures by cavitation and, at the same time, use leads having ends which require no special preparation for bonding operations.

SUMMARY OF THE INVENTION

It is, therefore, an object of the invention to provide an improved substrate terminal area for bonded leads, and a method of making the same.

It is a further object of the invention to provide for redundant bonding of simple leads to substrates.

It is a further object of the invention to minimize bonding stresses which tend to cause substrate cavitation.

In accordance with the present invention, a bond site on a substrate has at least two metallized regions and at least one non-metallized region interposed therebetween. One end of a lead is bonded to the metallized regions, the bond to each region being separated by the interposed region.

BRIEF DESCRIPTION OF THE DRAWING

The following detailed description of a preferred embodiment of the invention may be best understood when reference is made to the accompanying drawing wherein.

DETAILED DESCRIPTION

Figure 1:
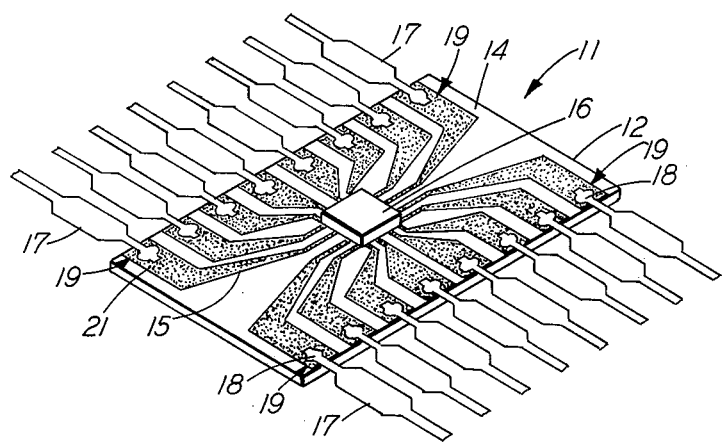
FIG. 1 is a typical product to which the invention is applicable.

Referring now to FIG. 1, there is shown an electronic device 11 which is representative of an article to which the present invention applies. The device 11 includes an insulative or dielectric substrate 12 which is typically of a material such as glass or a ceramic as, for instance, alumina. A surface 14 of the substance 11 has deposited thereon a conductive pattern 15. The pattern 15 is formed by conventional techniques employed in the electronics industry. For instance, a film for the pattern 15 may be formed by vapor deposition or by sputtering of materials such as titanium, palladium and by plating of gold to a typical total thickness of 20,000 angstroms. The pattern 15 is usually formed by selectively etching uniformly deposited metal films. The pattern is designed to provide circuit connections for one or more integrated circuit chips 16 on the substrate 12 and to couple the functions of the chips to beam leads 17 by which the device 11 is fitted into a circuit system (not shown).

In accordance with prior art techniques, mechanical and electrical interconnections between the leads 17 and the pattern 15 are typically formed by bonding one end 18 of each of the leads 17 to a corresponding bond site 19 on the substrate 12. A bond is typically formed by thermocompression bonding whereby a metal-to-metal bond is effected through the application of physical force as well as thermal energy. The leads 17 are typically at least coated with a metal, such as gold, that permits a ready bond to a top layer of the same metal on the substrate 12. The compressive force of a thermode (not shown) deforms the material of the leads 17 during the bonding operation into contact areas which are wider than the original widths of the leads 17. Metallization areas 21 at the bond sites 19 are larger than the widths of the leads 17 bonded thereto to accommodate the final widths of the bonded leads 17.

Figure 2:
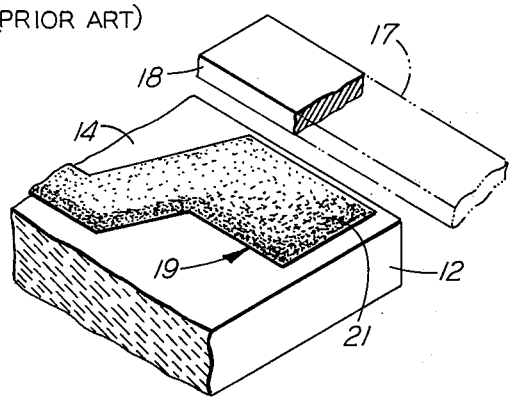
FIG. 2 is an enlarged view of a portion of a single lead and a corresponding bond site of the product of FIG. 1 prior to bonding the lead in accordance with the prior art.
Figure 3:
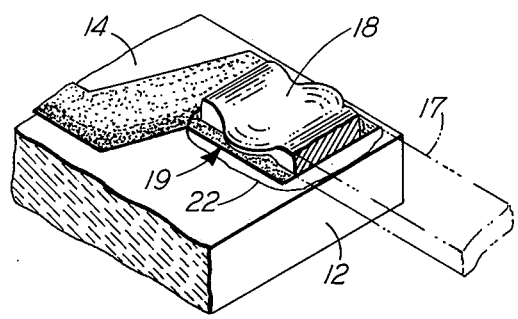
FIG. 3 is a view of the lead portion and the corresponding bond site of FIG. 1 shown after the lead has been bonded to the substrate in accordance with the prior art.

Referring now to FIGS. 2 and 3, a portion of a substrate 12 and one of the bond sites 19 on an enlarged scale show the metallization area 21 which represents typically a prior art bond site. The lead 17 is shown in FIG. 2 above its bond site 19. In FIG. 3, the end 18 of the lead is shown as being aligned with, brought into contact with, and bonded to, the metallization area 21. As the end 18 is deformed by the bonding pressure, the material of the lead is simultaneously heated to a point where a bond is formed between the lead 17 and the metallized area 21 on the substrate. After bonding, as the lead 17 cools, the material of the lead 17 contracts by an amount greater than that of the substrate, as it similarly cools. It is believed that a difference between the coefficient of thermal expansion of the lead 17 material and that of the substrate 12 material significantly contribute to bond failures by substrate cavitation. In FIG. 3, a typical fault 22 in the surface 14 of the substrate 12 is shown. The fault 22 progresses through the body of the substrate 12 until, at least on a percentage of all bonded leads, the lead 17 separates from the substrate 12 with the metallization area and at least some substrate material still clinging to the separated lead 17.

Figure 4:
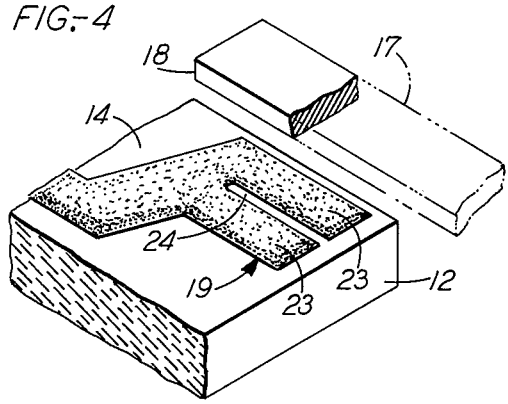
FIG. 4 is an enlarged view of a substrate showing a metallized bond site for attaching a lead in accordance with the present invention.
Figure 5:
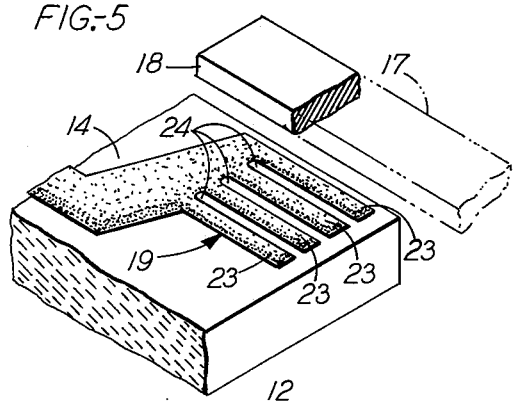
FIG. 5 is an enlarged view of a bond site relating to an alternate embodiment of the present invention.
Figure 6:
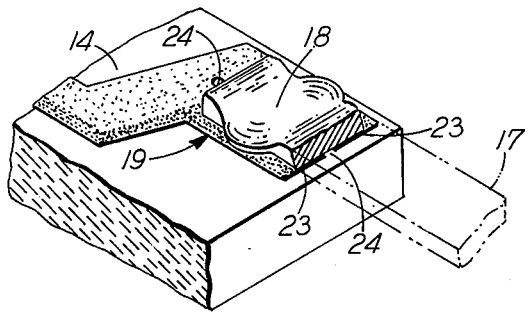
FIG. 6 shows the lead and the bond site of FIG. 4 bonded in accordance with the present invention.

Referring now to FIGS. 4, 5 and 6, the improvement of the present invention in attaching the leads 17 to the substrate 12 tends to reduce failures of the bonded leads 17 caused by the mechanism of substrate cavitation. In FIG. 4 a variation of the metallization area of the bond site 19 shows two metallized pads or regions 23, each of which occupy approximately one half of the intended bond site 19. The metallized regions 23 are separated by a nonmetallized region or slot 24 which extends preferably through the entire bond site so that an electrical continuity between the regions 23 is established at a point removed from the bond site 19.

Similar to the method of the prior art, the lead 17 is aligned with the bond site 19. However, because of the slot 24, the lead 17, when brought into contact with the bond site, contacts the two regions 23 separately. Thus, when the thermode (not shown) is brought into contact with the lead 17, two bonds are formed simultaneously, namely, a separate one with each of the regions 23. Because of the absence of metallization on the surface of the slot 24, the lead 17 does not bond to the substrate, so that the slot borders at least a length of one of the sides of each of the bonded regions 23 and separates the bonded regions from each other.

To form the two bonds, as shown in FIG. 6, the end 18 of the lead 17 need not be physically shaped prior to bonding. Consequently, the end 18 of the lead 17 is not different or altered from the shape of the end 18 of the lead 17 bonded in accordance with the prior art, as shown in FIG. 3. The described change in the pattern 15, however, to form the separate metallized regions 23 at the bond site is made simultaneously with the generation of the pattern 15. Typically, a photomask which includes at least two of the described regions 23 at each bond site 19 is used to selectively exposed a photoresist coating over the uniformly metallized substrate 12 to form the desired pattern 15 in accordance with the present invention.

As an alternate method of generating the regions 23 on substrates 12, a laser may be used to generate an opening or a slot 24 through central portions of the areas 21 of the prior art. While the slot 24 need not be centered to equally divide the remaining portions of the areas 21 such a substantially equal division is preferred. Also, the slot 24 need not extend in a straight line. The slot 24 may be curved or bifurcated or similarly altered to nonuniformly divide the metallized regions 23 within the bond site 21. Various other configurations of the metallized regions 23 are also within the scope of the present invention.

For instance, one alternate embodiment of the pattern 15 is shown in FIG. 5. Here a plurality of slots 24 separate a number of metallized regions 23 from each other. The lead 17, when bonded to the bond site 19, forms a number of bonds with the substrate 12, each bond being separated from an adjacent bond by the slot 24 on the substrate 12.

The leads 17 are bonded to the described bond sites 19 with typical bonding pressures and bonding temperatures. The force with which the thermode (not shown) bears against the leads 17 varies, of course, with the number of leads 17 to be bonded simultaneously. With each lead 17 being 0.020 inch in width and 0.010 inch in height, a bonding force is typically selected to be in the range of 25 pounds. A typical bonding temperature is 350° C for the usual gold-to-gold bonds.

As a result of bonds made according to the present invention, a plurality of bonds are formed between each lead 17 and the respective bond site 19 on the substrate 12. Significantly, no modifications need to be made to leads 17, and the leads are conventionally punched from strip stock material in the form of lead frames (not shown) as it is commonly done in the industry, or in the form of individual leads if it is so desired.

The slots 24 interrupt and separate the bonds between the lead 17 and the substrate 12. The faults 22, described with respect to the prior art bond of FIG. 2 appear to be arrested by the interruption of the bonds by the slots 24. It has been observed, for instance, that where a fault 22 occurs at a bond site of a lead 17 bonded in accordance with the present invention, the fault 22 tends to progress to the surface of the substrate at the nearest slot 24. Thus, if a failure due to substrate cavitation does occur, the tendency of the failure mechanism would be to destroy only one of the bonds between the lead 17 and the substrate 12. In addition, the bonding stresses, which cause the generation and propagation of faults 22, appear to be diminished on bonds made in accordance with the present invention with respect to those made in accordance with the prior art shown in FIG. 3. Consequently, the number of bond failures by substrate cavitation are reduced on such devices 11 where the leads 17 have been bonded to the substrate 12 in accordance with the present invention.

The above detailed description of the present invention and its application in the semiconductor industry has been made for illustrative purposes only. Variations and other embodiments are possible without departing from the scope and spirit of the invention. The invention is intended to be limited by the appended claims only.

What is claimed is:

1. An article comprising:
an insulating substrate having a conductive pattern thereon, the conductive pattern extending into at least one bond site on the surface of the substrate, the conductive pattern at the bond site including at least two conductive surface areas with at least one opening in the continuity of the conductive surface areas located between said conductive surface areas; and
a lead having one of its ends bonded to the conductive pattern at the bond site in a thermo-compression bond, and lead being joined to each of the conductive surface areas with heat and metal-deforming pressures, the lead spanning the opening in the continuity of the conductive surface areas of the pattern to provide a plurality of distinct thermo-compression bonds between the lead and the substrate to enhance the pullout strength between the lead and the substrate.

2. An article, which comprises:
a dielectric substrate having a metallized circuit pattern formed on and adhered to such substrate, the circuit pattern terminating in at least one bond site, the bond site including at least two metallized regions and at least one nonmetallized region, the nonmetallized region at least partially separating the metallized regions from each other; and
at least one lead bonded to the bonded site of the substrate, the lead contacting the bond site and forming bonded connections in lead deforming contact with the substrate at the metallized regions, the connections being at least in part separated by the nonmetallized regions.

3. An article according to claim 2, wherein the connections are thermocompression bonds.

4. An improved leaded device wherein one end of each lead is bonded to a metallized bond site of a substrate and the lead extends from the bond site, the improvement comprising:
at least two substantially separate metallized regions at the bond site; and a lead bonded in a lead-deforming contact to the bond site, each region forming a separate bond between the substrate and the lead.

* * * * *

UNITED STATES PATENT OFFICE
CERTIFICATE OF CORRECTION

Patent No. 4,034,149     Dated July 5, 1977

Inventor(s) Vincent J. Zaleckas

It is certified that error appears in the above-identified patent and that said Letters Patent are hereby corrected as shown below:

Column 1, line 60, "complaint" should be -- compliant --.

Column 2, line 57, "substance" should be -- substrate --.

Claim 1, line 23, "and" should be -- the --.

Signed and Sealed this

Twentieth Day of September 1977

[SEAL]

Attest:

RUTH C. MASON   LUTRELLE F. PARKER
Attesting Officer   Acting Commissioner of Patents and Trademarks